United States Patent [19]

Akama et al.

[11] Patent Number: 5,057,780
[45] Date of Patent: Oct. 15, 1991

[54] METHOD AND APPARATUS FOR MEASURING TRIGGER AND LATCHBACK VOLTAGE OF A SEMICONDUCTOR DEVICE

[75] Inventors: Hideo Akama, Hachiojishi; Norio Sone, Tachikawashi, both of Japan

[73] Assignee: Hewlett-Packard Co., Palo Alto, Calif.

[21] Appl. No.: 659,532

[22] Filed: Feb. 22, 1991

Related U.S. Application Data

[63] Continuation of Ser. No. 373,849, Jun. 29, 1989, abandoned.

[51] Int. Cl.⁵ .............................................. G01R 31/02
[52] U.S. Cl. ............................. 324/537; 324/158 D; 324/158 T; 324/719; 324/652
[58] Field of Search ............... 324/536, 537, 541, 544, 324/551, 554, 615, 719, 158 D, 158 T, 158 SC, 158 R, 409, 410, 403, 633, 652, 708; 331/129, 111, 143

[56] References Cited

U.S. PATENT DOCUMENTS

| 2,108,219 | 2/1938 | Swart | 331/129 |
|---|---|---|---|
| 2,167,496 | 7/1939 | Bauer | 331/129 |
| 2,231,591 | 2/1941 | Pieplow | 331/129 |
| 2,232,076 | 2/1941 | Newsam | 331/129 |
| 2,614,152 | 10/1952 | Herborn | 324/554 |
| 2,905,820 | 9/1959 | Boyle | 331/129 |
| 2,915,677 | 12/1959 | Dersch, Jr. | 331/129 |
| 3,147,430 | 9/1964 | Greenler | 324/554 |
| 4,295,062 | 10/1981 | Mihalich et al. | 331/111 X |
| 4,453,140 | 6/1984 | Gindrup | 331/111 |
| 4,544,879 | 10/1985 | Maeda et al. | 324/158 D |

OTHER PUBLICATIONS

"Standard Test Method for Resistivity of Silicon Epitaxial Layers by teh Three-Probe Voltage Breakdown Method", 1987 Annula Book of ATM Standards, Section 10, Electrical Insulation and Electronics, vol. 10.05, Electronics (II), pp. 224–231.
"Signal Diodes and Rectifying Diodes" and Zener Diodes, Instruction Manual, Type 576 Curve-Tracer, pp. 2-31,-2-32, Tectronix, Inc. (1969).
"SD 1224-2 VHF Communication Transistor", RF & Microwave Power Transistors, Data Book 1985, pp. 177-178, Thomson Semiconductors.

Primary Examiner—Kenneth A. Wieder
Assistant Examiner—Robert W. Mueller

[57] ABSTRACT

Disclosed is a measurement method and apparatus by which measurement of the breakdown voltage of a semiconductor device under test (DUT) may be conducted with an inexpensive measuring system in which thermal stress applied to the DUT is small and thus measurement error caused by characteristic change of the DUT is less. A constant current smaller than the breakdown current of the DUT is applied to a DUT using a constant current source, and waveforms between terminals of said DUT are observed by a waveform observation device, thereby measuring the trigger voltage and the latchback voltage. When a constant current I is applied to the DUT from the constant current source, a stray capacitance C between terminals of said DUT is charged. Thus, the voltage between terminals of said DUT is increased with a constant inclination (I/C) as time goes by.

6 Claims, 3 Drawing Sheets

METHOD AND APPARATUS FOR MEASURING TRIGGER AND LATCHBACK VOLTAGE OF A SEMICONDUCTOR DEVICE

This is a continuation of application Ser. No. 373,849, filed June 29, 1989, now abandoned.

BACKGROUND OF THE PRESENT INVENTION

There are two important voltage values in measuring a breakdown voltage of a semiconductor device. One is a voltage at which a device under test (DUT) presents a breakdown phenomenon when the voltage applied to the DUT is increased. This voltage is called a breakdown trigger voltage, and is hereafter referred to as a trigger voltage. The second is a voltage at which a breakdown phenomenon is ceases, that is, breakdown current is zero at this time, when the voltage applied to the DUT is gradually lowered. This voltage is called a breakdown latchback voltage, and is hereafter referred to as a latchback voltage.

Conventionally, a measuring circuit having a composition as shown in FIG. 3 (a) has been used for measuring such trigger voltage and latchback voltage. The measurement is taken in such a manner that pulse signal is applied to a DUT 101 by a pulse generator 301 and the current flowing in the DUT 101 is connected through a current probe 302 and the voltage Vd between terminals of the DUT 101 is connected directly to respective channel inputs of an oscilloscope 303, thus observing waveforms. FIG. 3 (b) shows these measured waveforms. It is understood that the trigger voltage and the latchback voltage are measured, respectively.

However, there are some drawbacks in this measuring method. First of all, a large current is applied to the DUT at the time of breakdown phenomenon and there is a fear that the DUT is destroyed because of thermal and electrical stresses. In particular, as individual semiconductor elements become smaller, they are more susceptible to thermal and electrical stresses. Also, the temperature of the DUT itself rises due to heat generated by the electrical current, and characteristic change of the DUT is induced, thus making it impossible to take an accurate measurement. Furthermore, a high speed waveform observation in the order of 0.1 sec is microsecond is required for observing such a breakdown phenomenon, which makes the measuring system expensive.

SUMMARY OF THE PRESENT INVENTION

The present invention solves the aforementioned problems with a method and apparatus for measuring by which measuring may be conducted with an inexpensive measuring system in which thermal stress applied to the DUT is small and thus a measurement error caused by characteristic change of the DUT is less.

According to an embodiment of the present invention, a constant current smaller than the breakdown current is applied to a DUT using a constant current source, and waveforms between terminals of said DUT are observed by a waveform observation device, thereby measuring the trigger voltage and the latchback voltage.

When a constant current I is applied to the DUT from the constant current source, a stray capacitance C between terminals of said DUT is charged. Thus, the voltage between terminals of said DUT is increased with a constant inclination (I/C) as time goes by.

If the constant current I has been set in advance at a value lower than the breakdown current at this time, the breakdown current flows when this voltage reaches the trigger voltage, thus the current supply by the current source becomes insufficient and the voltage between terminals of the DUT starts to go down. When this voltage goes down to the latchback voltage, the breakdown phenomenon ceases and the breakdown current becomes zero. Therefore, the voltage between terminals of the DUT starts to rise again with the inclination of I/C as time goes by. This operation is performed repeatedly. When such a state of affairs is observed with an oscilloscope, a saw-tooth wave is observed, but the voltage at a crest thereof shows the trigger voltage and the voltage at a trough thereof shows the latchback voltage. With this, the breakdown voltage is measured. By means of such composition, no excessive current flows in the DUT, thus thermal stress applied to the DUT becomes small, the characteristic change of the DUT itself caused by heat generation becomes small, and the measurement error also becomes small. Furthermore, since a low speed waveform observation device may be used, an inexpensive measurement system may be constructed.

DETAILED DESCRIPTION OF THE INVENTION

Figure 1B:
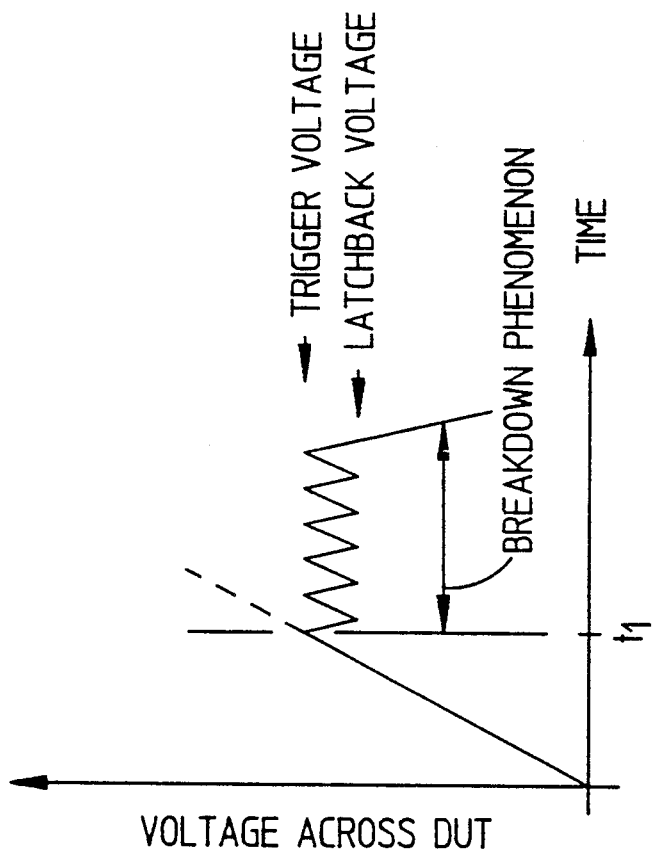
FIG. 1 shows an embodiment according to the present invention, (a) showing the composition thereof, and (b) a waveform diagram for explaining the operation thereof.

FIG. 1 (a) shows an embodiment according to the present invention. As shown in the Figure, a constant current I is applied to a DUT 101 from a constant current source 102. This current I charges a stray capacity C between terminals of the DUT 101. Therefore, the voltage between terminals of the DUT 101 rises over time with the inclination I/C. When this voltage reaches a trigger voltage, the DUT incurs a breakdown and a breakdown current flows abruptly. However, when a constant current I is set in advance at a predetermined value lower than the breakdown current, the voltage between the terminals of the DUT 101 starts to go down. When this voltage goes down and reaches a latchback voltage, the breakdown phenomenon ceases and the breakdown current ceases to flow. Therefore, the voltage between terminals of the DUT 101 rises over time again with the inclination I/C. This operation is performed repeatedly and a saw-tooth wave varying time-wise is generated. The trigger voltage and the latchback voltage are measured through the observation of the aforementioned saw-tooth wave of the voltage between terminals of the DUT 101 using a waveform observation device 103 such as an oscilloscope. That is, the voltage at the crest of the saw-tooth wave shows the trigger voltage and the voltage at the trough shows the latchback voltage. Such a state of affairs is shown in FIG. 1 (b). Here, the constant current source 102 provides a constant current for a voltage higher than the breakdown voltage of the DUT 101.

Figure 2:
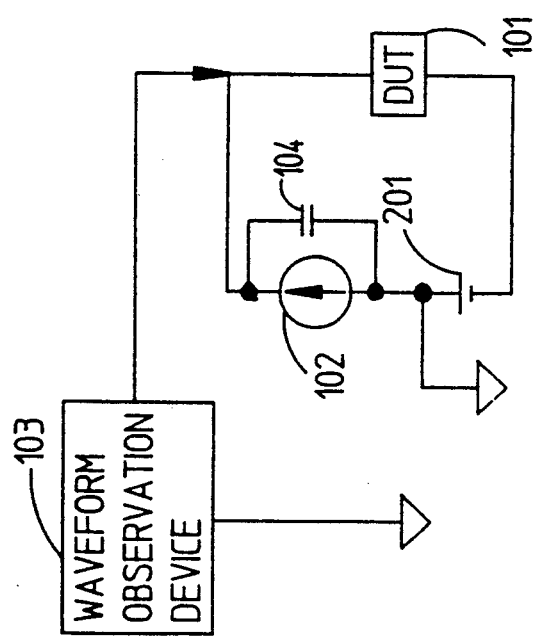
FIG. 2 shows another embodiment according to the present invention.
Figure 3B:
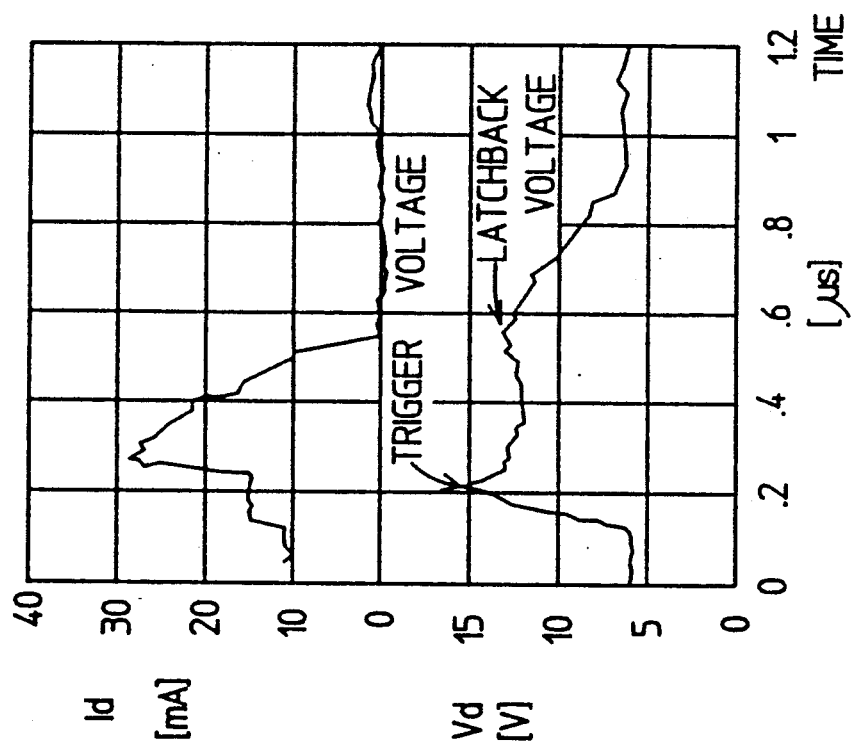

FIG. 2 shows another embodiment according to the present invention. In said embodiment, the DUT 101 is connected to a constant voltage source 201 at a terminal on the opposite side of the constant current source 102 to collectively define a measurement unit. Measurement is taken by increasing the size of the constant voltage source 201 gradually until the breakdown phenomenon is presented. In this case, it means that a negative voltage whose absolute value gradually increases is applied to an end of the DUT 101. Prior to onset of the breakdown phenomenon, the current flowing in the DUT is smaller than the constant output current I of the constant current source 102. Therefore, the constant current source 102 is saturated. When the DUT 101 incurs a breakdown phenomenon, the constant current source 102 is operated, thereby generating a saw-tooth wave as described above. This saw-tooth wave is observed with a waveform observation device 103. However the voltage observed by device 103 are apparent trigger and latchback voltages of the measurement unit. The apparent trigger and latchback voltages are smaller in magnitude than the actual trigger and latchback voltages of the device-under-test. The breakdown voltage is measured with the voltage at the crest and the voltage at the trough and the output voltage of the constant voltage source 201 at this time. As shown in FIG. 2, the voltage observed by device 103 includes the voltage across DUT 101 and the voltage across voltage source 201. Consequently, the actual trigger and latchback voltages, i.e., the voltage across only DUT 101, must be calculated by removing the DC voltage contributed by source 201. Since the DC voltage is known and the apparent voltage is know, the calculation is simple. In this circuit, it is possible to reduce the dynamic range required for the constant current source 102 and the waveform observation device 103.

In addition, it is possible in above-mentioned embodiments that the trigger voltage and the latchback voltage are measured by using a peak detector and a voltmeter in place of an oscilloscope as the waveform observation device 103.

Figure 1A:
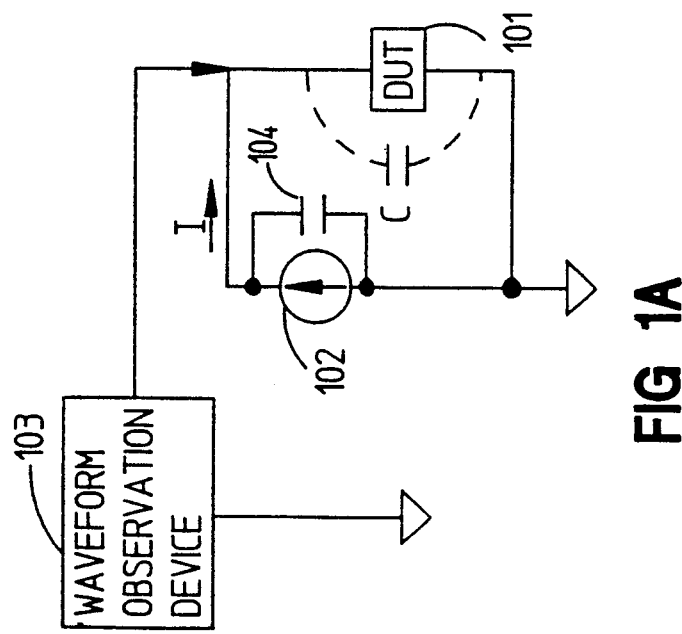
Figure 3A:
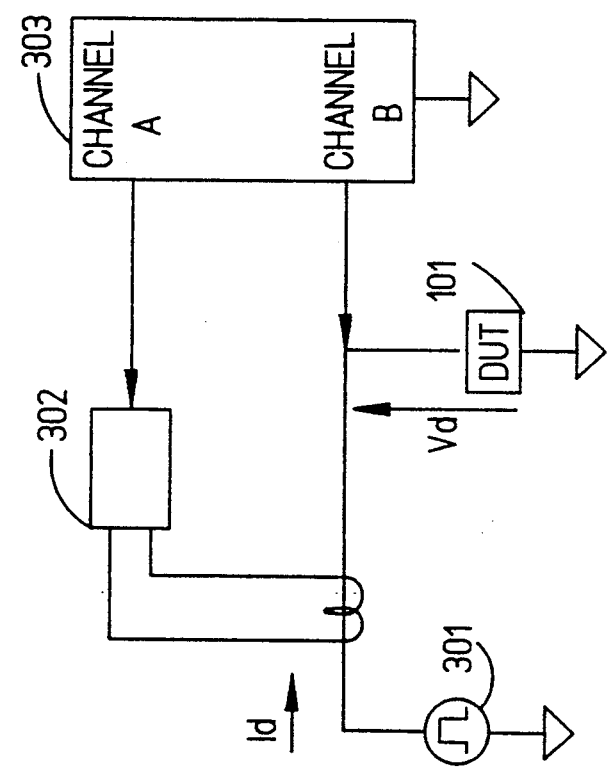
FIG. 3 shows a conventional breakdown voltage measuring circuit, (a) showing the composition thereof and (b) showing observed waveforms.

In addition to what has been previously described, FIGS. 1A and 2 also show capacitor 104 connected in parallel with current source 102. Capacitor 104 serves to lower the frequency of the oscillating voltage across DUT 101.

As explained above, according to the present invention, it is possible to measure the breakdown voltage of a semiconductor device with an inexpensive measuring system thereby decreasing thermal stress thereby decreasing the error caused by the characteristic change of the DUT.

What is claim is:

1. A method for measuring the trigger voltage and latchback voltage of a semiconductor device-under-test having a given breakdown current, comprising the steps of:
   applying a constant current to the device-under-test of a magnitude so that an oscillating voltage is sustained across the device-under-test, wherein said oscillating voltage is in response to the flow of breakdown current in said device-under-test, said constant current being less than said breakdown current; and
   observing the voltage across the device-under-test for measuring at least one of a trigger voltage and a latchback voltage.

2. An apparatus for measuring the trigger voltage and latchback voltage of a semiconductor device under test having a given breakdown current, comprising:
   a current source for applying a constant current to the device-under-test, said constant current being of a magnitude so that an oscillating voltage is sustained across the device-under-test, wherein said oscillating voltage is in response to the flow of breakdown current in said device-under-test, wherein said predetermined constant current is less than said breakdown current; and
   a voltage measuring device to measure the voltage across the device-under-test to identify at least one of a breakdown trigger voltage and a breakdown latchback voltage.

3. The apparatus for measuring breakdown voltages as claimed in claim 2, wherein the current source has additional parallel capacitance to lower frequency of the oscillation.

4. A method for measuring trigger voltage and latchback voltage of a device-under-test, comprising the steps of:
   connecting a variable DC voltage source to the device-under-test and varying the magnitude of the DC voltage applied to the device-under-test until breakdown occurs;
   connecting a current source to the device-under-test thereby applying a current to the device-under-test, whereby the variable DC voltage source and the current source define a unit, and wherein the current applied by the current source is of a magnitude so that an oscillating voltage is sustained across the unit, wherein said oscillating voltage is in response to the flow of breakdown current in said device-under-test;
   measuring the voltage across the measuring unit which measurement is representative of apparent trigger and latchback voltages, whereby apparent trigger and latchback voltages are smaller in magnitude than the actual trigger and latchback voltages of the device-under-test; and
   calculating the actual trigger and latchback voltages of the device-under-test in relation to the voltage measured across the unit and to the DC voltage applied to the device-under-test.

5. An apparatus for measuring the trigger voltage and latchback voltage of a device-under-test, comprising:
   a variable DC voltage source, connected to the device-under-test, wherein the magnitude of the DC voltage applied to the device-under-test can be varied until breakdown occurs;
   a constant current source connected to the device-under-test thereby applying a current to the device-under-test, whereby the variable DC voltage source and the current source define a unit, and wherein the current applied by the current source is of a magnitude so that an oscillating voltage is sustained across the unit, wherein said oscillating voltage is in response to the flow of breakdown current in said device-under-test; and
   a measuring device for measuring the voltage across the unit which measured voltage is representative of apparent trigger and latchback voltages, whereby apparent trigger and latchback voltages are smaller in magnitude than the actual trigger and latchback voltages of the device-under-test so that the breakdown voltage of the device-under-test can be calculated in relation to the voltage measured across the unit and to the DC voltage applied to the device-under-test.

6. The apparatus for measuring breakdown voltages as claimed in claim 5, wherein the current source has additional parallel capacitance to lower frequency of the oscillation.

* * * * *